US006803302B2

(12) United States Patent
Pozder et al.

(10) Patent No.: US 6,803,302 B2
(45) Date of Patent: Oct. 12, 2004

(54) METHOD FOR FORMING A SEMICONDUCTOR DEVICE HAVING A MECHANICALLY ROBUST PAD INTERFACE

(75) Inventors: Scott K. Pozder, Austin, TX (US); Thomas S. Kobayashi, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 313 days.

(21) Appl. No.: 09/443,443

(22) Filed: Nov. 22, 1999

(65) Prior Publication Data

US 2001/0051426 A1 Dec. 13, 2001

(51) Int. Cl.[7] .............................................. H01L 21/44
(52) U.S. Cl. ....................................................... 438/612
(58) Field of Search .......................................... 438/612

(56) References Cited

U.S. PATENT DOCUMENTS

| | | | |
|---|---|---|---|
| 4,723,197 A | * | 2/1988 | Takiar et al. |
| 5,149,674 A | * | 9/1992 | Freeman, Jr. et al. |
| 5,284,797 A | | 2/1994 | Heim |
| 5,719,448 A | | 2/1998 | Ichikawa |
| 5,736,791 A | | 4/1998 | Fujiki et al. |
| 5,804,883 A | | 9/1998 | Kim et al. |
| 5,912,510 A | * | 6/1999 | Hwang et al. |
| 5,923,088 A | | 7/1999 | Shiue et al. |
| 5,942,448 A | * | 8/1999 | White |
| 5,989,991 A | * | 11/1999 | Lien ........................... 438/612 |
| 6,187,680 B1 | * | 2/2001 | Costrini et al. .............. 438/611 |
| 6,191,023 B1 | | 2/2001 | Chen ........................... 438/612 |
| 6,197,613 B1 | * | 3/2001 | Kung et al. ................... 438/106 |

FOREIGN PATENT DOCUMENTS

JP      11-186434      7/1999

OTHER PUBLICATIONS

English translation of Notification of the First Office Action from the Patent Office of the People's Republic of China for SC10861 TP Chin, Date of Notification, Dec. 12, 2003.
Semiconductor International, Nov. 1999, www.semiconductor.net, "Solving Low–kIntegration Challenges", pp. 56–57.

\* cited by examiner

Primary Examiner—George Fourson
Assistant Examiner—Michelle Estrada

(57) ABSTRACT

A composite bond pad that is resistant to external forces that may be applied during probing or packaging operations is presented. The composite bond pad includes a non-self-passivating conductive bond pad (134) that is formed over a semiconductor substrate (100). A dielectric layer (136) is then formed over the conductive bond pad (134). Portions of the dielectric layer (136) are removed such that the dielectric layer (136) becomes perforated and a portion of the conductive bond pad (134) is exposed. Remaining portions of the dielectric layer (136) form support structures (138) that overlie that bond pad. A self-passivating conductive capping layer (204) is then formed overlying the bond pad structure, where the perforations in the dielectric layer (136) allow for electrical contact between the capping layer (204) and the exposed portions of the underlying bond pad (134). The support structures (138) provide a mechanical barrier that protects the interface between the capping layer (204) and the bond pad (134). Additional mechanical robustness is achieved when the support structures (138) remain coupled to the unremoved portion of the dielectric layer (136), as forces buffered by the support structures (138) are distributed across the dielectric layer (136) and not concentrated at the bond pad location.

16 Claims, 4 Drawing Sheets

METHOD FOR FORMING A SEMICONDUCTOR DEVICE HAVING A MECHANICALLY ROBUST PAD INTERFACE

RELATED APPLICATIONS

The present Application is related to U.S. patent application Ser. No. 09/411,266 filed Oct. 4, 1999, and entitled "Semiconductor Device and Method of Formation," which is assigned to the assignee hereof and is herein incorporated by reference.

FIELD OF THE INVENTION

The invention relates generally to integrated circuits and more particularly to a mechanically robust bond pad interface used in integrated circuits.

BACKGROUND OF THE INVENTION

Integrated circuits are formed on semiconductor substrates using a number of different processing operations that create the circuit elements. In order to access circuitry associated with the semiconductor substrate, bond pads are formed on the integrated circuits. Bond pads provide the means for transfer of electrical signals and power from and to the die via probe needles, bonding wires, conductive bumps, etc.

Bond pads are typically formed of a conductive metal such as aluminum, copper, or some alloy thereof. Copper is often used for the metal layers within the integrated circuit because of its improved electromigration performance and ability to support higher current density as compared to aluminum. However, copper is a non-self-passivating metal, and oxidation or corrosion of copper bond pads can occur when the die is exposed to the atmosphere or a non-hermitic package allows moisture to interact with the copper bond pad. This corrosion can degrade the ability to bond leads or bumps to the bond pads and can also cause the bond to decay and fail over time. In contrast, aluminum is self-passivating and, therefore, more resistant to degradation from atmospheric exposure. As such, aluminum is typically used to form bond pads.

In order to realize the advantages of the self-passivating character of aluminum and the superior electrical characteristics of copper, composite bond pad structures can be used in integrated circuit designs. In composite bond pad structures, copper is used for the underlying layer of the pad that interfaces with other layers in the integrated circuit. A corrosion-resistant aluminum capping layer is formed on top of the copper portion that creates a hermetic seal that protects the copper portion from atmospheric exposure. In order to physically separate the copper and aluminum portions of the composite bond pad while allowing for electrical connectivity, a relatively thin barrier metal layer may be formed at the interface.

Problems can arise in composite bond pad structures when test and probe operations are performed. To achieve good electrical continuity with the bond pad, elements such as probing needles must exert forces that can damage or displace portions of the bond pad surface. As such, the physical contact by such elements can damage the interface between the different metals comprising the composite bond pad structure. The damage produced can result in the formation of intermetallics at the copper-aluminum interface if the barrier is broken between the underlying copper layer and the aluminum capping layer. The aluminum-copper intermetallic can have undesirable characteristics including reduced physical strength and increased resistivity. In addition, if the probe exposes the underlying copper to the external ambient conditions, degradation of the copper can occur.

Another problem that can arise with bond pad structures concerns the physical force exerted on the bond pad by a probing element propagating to lower layers based on the physical couplings within the integrated circuit. Low Young's modulus dielectrics underlying the bond pad may not be able to support such stress resulting from the force propagation. Magnification of applied forces due to leveraging by extended interconnect may result in mechanical and eventual electrical failure of the semiconductor device. Such degradation due to the magnified applied forces typically occurs at interfaces within the integrated circuits such as via to metal interfaces and the like. Damage due to the application of force may also be increased when a more pliable dielectric (that having a lower Young's modulus or yield strength) surrounds the components being stressed.

Therefore, a need exists for a composite bond pad structure that is mechanically robust such that forces applied by probing or packaging operations do not cause degradation of the bond pad or propagate to internal portions of the integrated circuit where other undesirable effects may occur.

BRIEF DESCRIPTION OF THE DRAWINGS

The present invention is illustrated by way of example and not limitation in the accompanying figures, in which like references indicate similar elements, and in which.

Figure 1:
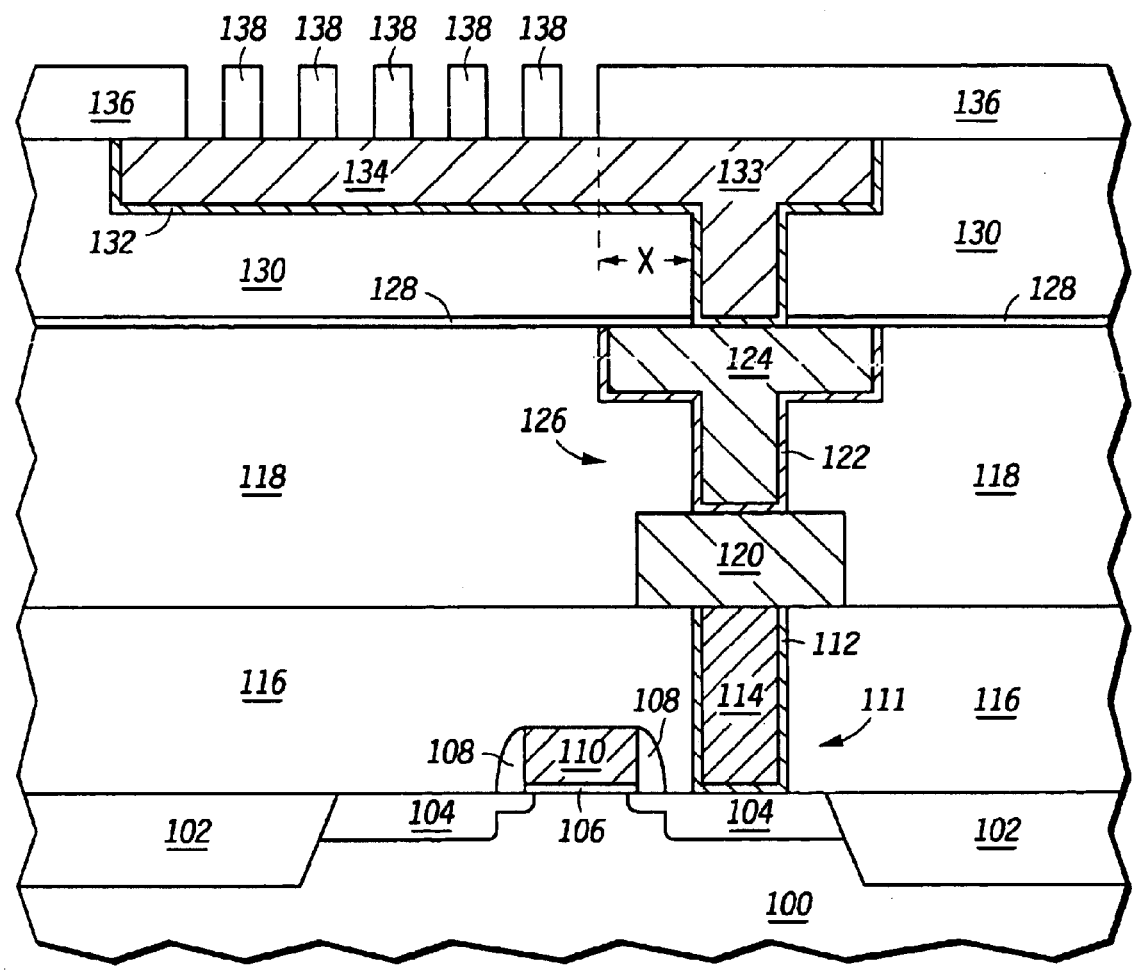
FIG. 1 illustrates a cross sectional view of a portion of a semiconductor die that includes a partially formed composite bond pad in accordance with a particular embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Generally, the present invention provides a composite bond pad that is resistant to external forces that may be applied during probing operations, packaging operations, or other similar post-fabrication operations that utilize the bond pads. The composite bond pad includes a non-self-passivating conductive bond pad that is formed over a semiconductor substrate. A dielectric layer is then formed over the conductive bond pad. Portions of the dielectric layer are removed such that the dielectric layer becomes perforated and a portion of the conductive bond pad is exposed. Remaining portions of the dielectric layer form support structures that overlie that bond pad. A self-passivating conductive capping layer is then formed overlying the bond pad structure, where the perforations in the dielectric layer allow for electrical contact between the capping layer and the exposed portions of the underlying bond pad. The support structures provide a mechanical barrier that protects the interface between the capping layer and the bond pad. Additional mechanical robustness is achieved when the support structures remain coupled to the unremoved portion of the dielectric layer, as forces buffered by the support structures are distributed across the dielectric layer and not concentrated at the bond pad location.

In probing operations, the support structures prevent probing elements such as needles from penetrating through the capping layer and disturbing the interface between the capping layer and the conductive bond pad. If a probe needle manages to displace a large amount of the capping layer, electrical contact between bond wires or other packaging structures is still possible as conductive material remains within the perforations of the dielectric layer. In addition to these advantages, by configuring the perforated dielectric layer such that mechanical forces applied to the capping layer are distributed across a greater surface area of the dielectric layer, the potential for internal degradation of the integrated circuit due to a point application of force is greatly reduced.

In an alternate embodiment, additional mechanical support is obtained through the use of dielectric studs that are included in the conductive bond pad portion (inlaid metal portion) of the composite bond pad. Such studs are commonly used in the art to alleviate dishing (uneven metal removal) during polishing operations. The added mechanical support is further improved when the studs are positioned beneath the support structures of the perforated dielectric layer. In some cases, the studs may also increase the adhesion of the capping layer to the underlying bond pad structure.

The invention can be better understood with reference to FIGS. 1–6. FIG. 1 includes an illustration of a cross sectional view of a portion of a semiconductor device. The semiconductor device includes a semiconductor device substrate 100, field isolation regions 102, and doped regions 104 formed within the semiconductor device substrate 100. A gate dielectric layer 106 overlies portions of the semiconductor device substrate 100, and a gate electrode 110 overlies the gate dielectric layer 106. Spacers 108 are formed adjacent the sidewalls of the gate electrode 110. A first interlevel dielectric layer (IDL) 116 is patterned to form a contact opening that is filled with an adhesion layer 112 (optional) and a contact fill material 114. The adhesion layer 112 is typically a refractory metal, a refractory metal nitride, or a combination of refractory metals or their nitrides. The contact fill material 114 typically includes tungsten, polysilicon, or the like. After depositing the adhesion layer 112 and the contact fill material 114, the substrate is polished to remove portions of the adhesion layer 112 and contact fill material 114 not contained within the contact opening to form the conductive plug 111.

A first level interconnect 120 is then formed overlying the interlevel dielectric (ILD) layer 116 and the conductive plug 111. The first level interconnect 120 can be formed using a combination of trench and polishing processes or, alternatively, using a combination of patterning and etching processes. If the first level interconnect 120 is formed using copper, a barrier (not shown) may be formed adjacent to the first level interconnect 120 to reduce the migration of copper into surrounding materials.

In accordance with one embodiment, the first level interconnect 120 is formed as a single inlaid structure. As such, the first level interconnect 120 is created by first depositing a portion of the second ILD 118 which is then etched to form a trench in which the material that makes up the first level interconnect 120 is deposited. Once deposition of the first level interconnect 120 occurs, a polishing process removes any excess material that remains outside of the trench formed.

Assuming that the first level interconnect 120 has been formed as a single inlaid structure, the remainder of the second ILD 118 is formed subsequent to the polishing step. An interconnect 126 that can include a conductive adhesion/barrier film 122 and a copper material 124 is then formed within the second ILD 118. The adhesion/barrier film 122 is typically a refractory metal, a refractory metal nitride, or a combination of refractory metals or their nitrides. The copper fill material 124 is typically copper or a copper alloy, where the copper content is at least 90 atomic percent. The copper can be alloyed with magnesium, sulfur, carbon, or the like to improve adhesion, electromigration or other properties of the interconnect. Although the interconnect 126 is illustrated in this embodiment as a dual inlaid interconnect, one of ordinary skill in the art recognizes that the interconnect 126 can alternatively be formed as a conductive plug in combination with a single inlaid interconnect or a lithographically patterned and etched interconnect. After depositing the adhesion barrier film 122 and the copper fill material 124, the substrate is polished to remove portions of adhesion/barrier film 122 and copper fill material 124 not contained within the dual inlaid opening to form the dual inlaid interconnect 126 shown in FIG. 1.

A third ILD 130 is then formed over the second ILD 118 and the dual inlaid interconnect 126. The third ILD 130 and any other underlying dielectric layers can include materials such as tetraethylothosilicate (TEOS), silicon nitride, silicon oxynitride, phosphosilicate glass (PSG), borophosphosilicate glass (BPSG), low dielectric constant materials such as xerogel, aerogel, polyimide, parylene, biscyclobutenes, fluorocarbons, polyarylether-based materials, spin on glass, polysiloxanes, silsesquioxanes, carbon-containing silicon oxide, carbon and hydrogen containing silicon oxide, or a combination thereof. The third ILD 130 and any other underlying dielectric layers can include a material that has a Young's modulus that is less than approximately 50 Giga Pascals. In other embodiments, the third ILD 130 may be formed of other materials that have a lower yield strength and are therefore more pliable. Although the portion of the semiconductor device illustrated in FIG. 1 includes three layers of interconnect, a plurality of interconnect layers could be interspersed between the device layer and the top most layer which is used to provide bond pad access to the semiconductor device. In the embodiment illustrated in FIG. 1, the bond pad structure is formed within the uppermost (third) ILD 130.

The uppermost interconnect level 133, which includes the conductive bond pad 134 is then formed within the third ILD 130 in a manner similar to that used to form the interconnect 126 within the second ILD 118. Typically, the uppermost interconnect level 133 includes mostly copper, but in other embodiments, a self-passivating material such as aluminum may be used. As was the case with the copper fill material 124 of the interconnect 126, the fill material used to form the uppermost interconnect level 133 may be separated from the third ILD 130 by a conductive adhesion/barrier film 132. In accordance with one embodiment, the conductive bond pad 134 is positioned some distance from the via (interlevel interconnect), which is used to contact the interconnect 126. This is represented by distance X illustrated in FIG. 1.

A dielectric (passivation) layer 136 is then formed over the uppermost interconnect level 133 and the conductive bond pad 134. Typically, the dielectric layer 136 is formed of a nitrogen-containing compound. Alternatively, the dielectric layer can include silicon oxide, silicon oxynitride, a hydrogen and carbon containing silicon oxide, or the like. Portions of the dielectric layer are removed to form a perforated region within the dielectric layer that includes a plurality of support structures 138. The perforated region is formed to overlie the conductive bond pad 134 in the area in which the composite bond pad is to be formed such that a portion of the conductive bond pad 134 is exposed. In some embodiments, the plurality of support structures 138 remain connected to portions of the dielectric layer 134 which have not been removed.

Figure 2:
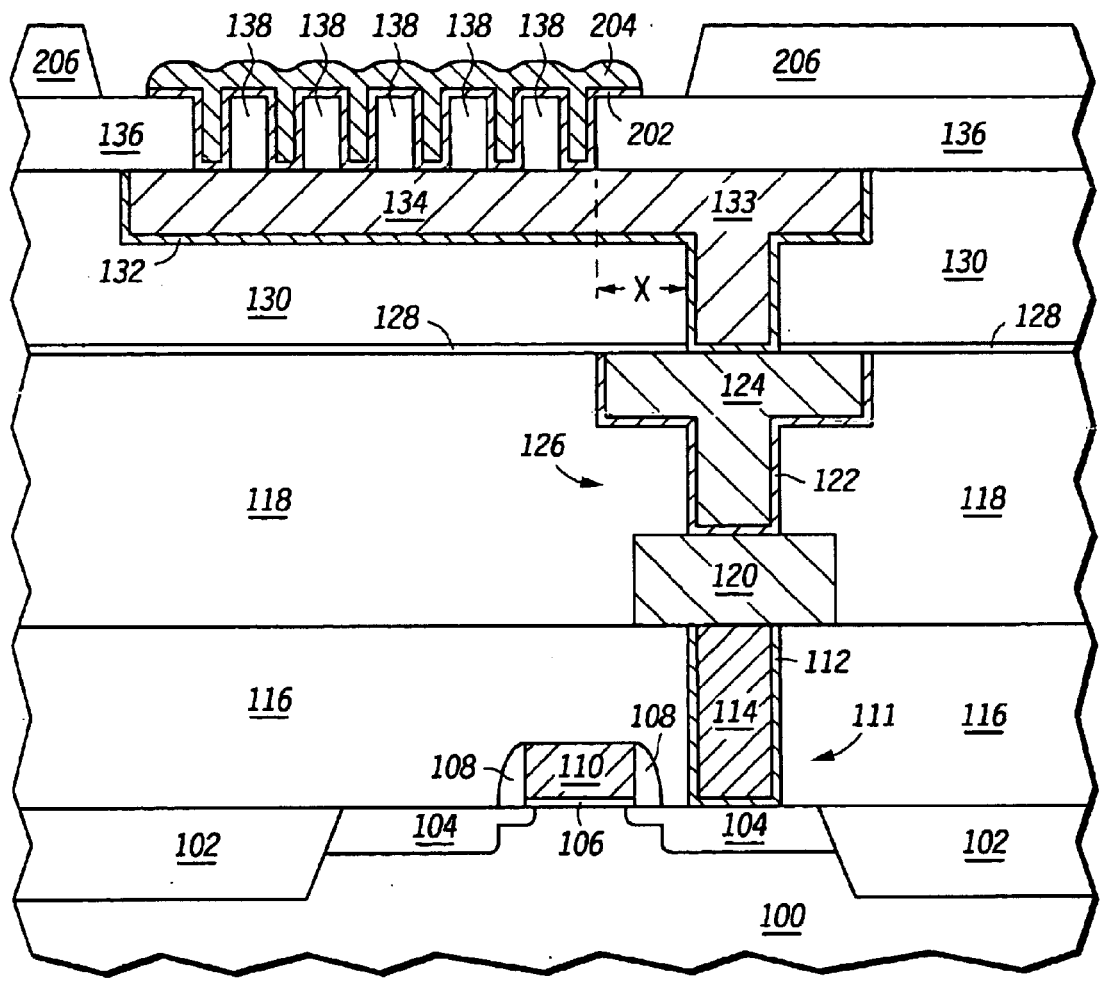
FIG. 2 illustrates a cross sectional view of a semiconductor die that includes a composite bond pad in accordance with a particular embodiment of the present invention.

Formation of the composite bond pad is continued in FIG. 2. FIG. 2 illustrates a cross sectional view of the portion of the semiconductor device illustrated in FIG. 1 after subsequent processing steps. In accordance with one embodiment, a barrier layer 202, which may include tantalum, titanium, tungsten, chromium, or the nitrides of these materials is formed within the perforated portion of the dielectric layer 136. A conductive capping layer 204 is then formed over the plurality of support structures 138. Typically, the conductive capping layer includes a self-passivating material such as aluminum. The conductive capping layer 204 may also include nickel or palladium. The conductive capping layer 204 may subsequently be attached to a wirebond or electrically coupled to a conductive bump during packaging of the semiconductor device.

The perforations in the dielectric layer 136 permit electrical contact between the self-passivating material that makes up the capping layer 204 and the conductive bond pad 134. However, the support structures 138 provide mechanical shielding of the interface formed between the capping layer 204 and the conductive bond pad 134. Note that if the support structures 138 are interconnected with unremoved portions of the dielectric layer 136, additional mechanical shielding of the semiconductor device with respect to external forces is achieved. This is because external forces applied at the capping layer 204 of the composite bond pad will be distributed across the dielectric layer 136. The external forces may be the result of probing, wire bonding, bumping, packaging, etc.

In order to provide stress relief between the semiconductor device and the packaging material used in conjunction with the semiconductor device, a polyimide layer 206 may be formed on the semiconductor device after the composite bond pad structures has been completed. The inclusion of the polyimide layer 206 is an optional step that is dependent upon the particular manufacturing process employed.

Figure 3:
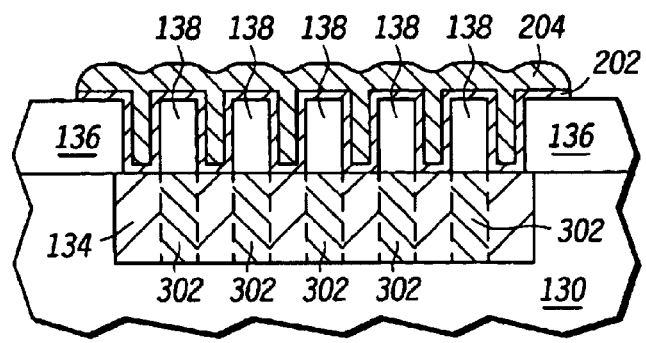
FIG. 3 illustrates a cross sectional view of another composite bond pad as implemented in accordance with an alternate embodiment of the present invention.

FIG. 3 illustrates an alternate embodiment of the invention that includes a plurality of dielectric studs 302 within the conductive bond pad portion 134 of the composite bond pad structure. As is illustrated, the dielectric studs 302 are typically positioned beneath the support structures 138 within the perforated portion of the dielectric layer 136. Positioning the dielectric studs 302 beneath the support structures 138 increases the mechanical support provided to the support structures 138 such that the robust nature of the composite bond pad structure is enhanced. This enhancement is due to the transference of force from the support structures 138 through the dielectric studs 302 to the third ILD 130. The positioning of the dielectric studs 302 beneath the support structures 138 is also advantageous in that it does not reduce the contact area provided for the interface between the capping layer 204 and the conductive bond pad 134.

Figure 4:
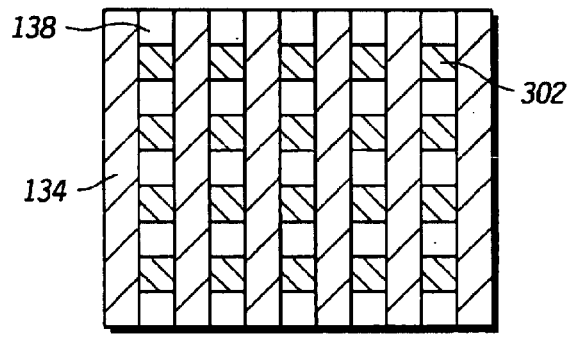
FIG. 4 illustrates a top down view of the bond pad illustrated in FIG. 3.

FIG. 4 illustrates a top down view of the composite bond pad structure of FIG. 3 (the capping layer is assume to be transparent for purposes of illustration). As is illustrated, the dielectric studs 302 are included in the composite bond pad structure in an arrayed format. The support structures 138 included in the perforated portion of the dielectric layer 136 are shown as strips of dielectric material that extend across the length of the bond pad structure. Although the bond pad structure of FIG. 4 is shown to be generally square, it should be apparent to those of ordinary skill in the art that various shaped bond pad structures may be implemented.

Figure 5:
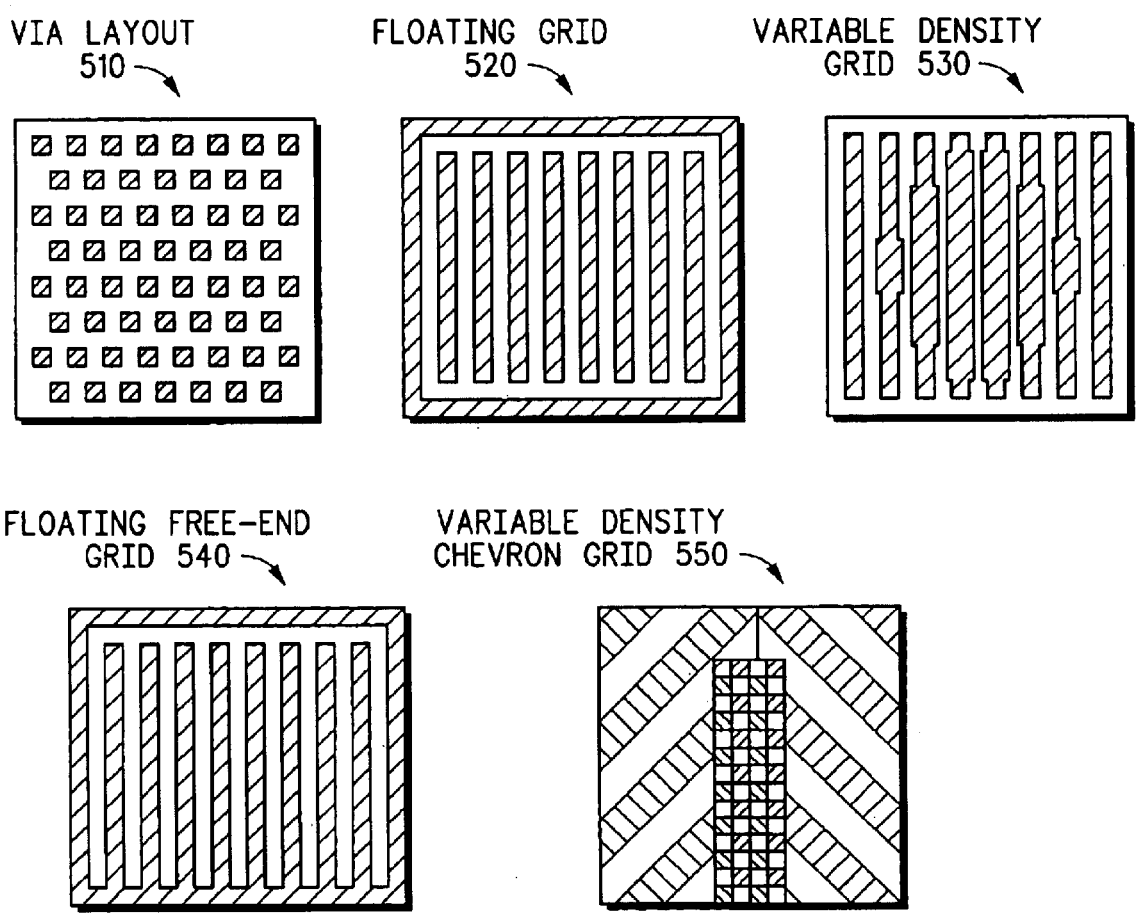
FIG. 5 illustrates a plurality of top down views corresponding to potential support structure configurations corresponding to composite bond pads in accordance with the present invention.

FIG. 5 illustrates a plurality of alternate perforation patterns that may be utilized to enable the capping layer to electrically connect with the bond pad portion of the composite bond pad structure while providing a degree of physical isolation with respect to the interface between these two portions of the composite bond pad structure. Each of the different patterns includes advantages that may be desirable for different embodiments. The perforation layout pattern 510 provides an array of via connections between the capping layer and the bond pad portion. Because the majority of the passivation (dielectric) layer in the perforation layout pattern 510 is left intact, the force tolerance when using this pattern may be relatively greater than other patterns illustrated.

The floating grid pattern 520 provides an isolated support structure portion that effectively floats without physical connection to the remaining portion of the dielectric layer. The floating grid pattern 520 provides additional robustness with respect to sheer stress that may be applied to the capping layer. However, the area over which the force applied is distributed is reduced from those patterns that remain attached to the remaining portion of the dielectric layer.

The variable density grid structure 530 may provide advantages in terms of steering probe needles or other testing apparatus to particular portions of the bond pad structure. This is accomplished due to the uneven topography of the metal layer that may be caused by the presence or absence of dielectric material. Large gaps between support structures may permit metal to be deposited in an uneven manner that can leave less metal material in the larger gaps and therefore a lower topography as the metal fills the gap rather than building up on the dielectric support structure. Typically, the pattern is designed such that an indentation is created at a central portion or other desirable location of the composite bond pad structure such that the probe needle will migrate toward this depressed area.

The floating free-end grid pattern 540 may provide some of the advantages that were provided by the floating grid structure 520 with respect to sheer stresses while maintaining a physical link to the overall dielectric layer. As such, the sheer stress robustness may not be as great as that of a floating grid pattern 520, but the distribution of applied force is maintained over a broader area.

The variable density chevron grid 550 may provide an alternate pattern for steering a probe needle or similar testing device to a particular location on the bond pad structure. In the case of the variable density chevron grid 550, this is achieved by the creation of furrows, or directional tracts of metal material such that a probe needle will contact the structure and be directed by the furrows to a preferred area of the bond bad.

Figure 6:
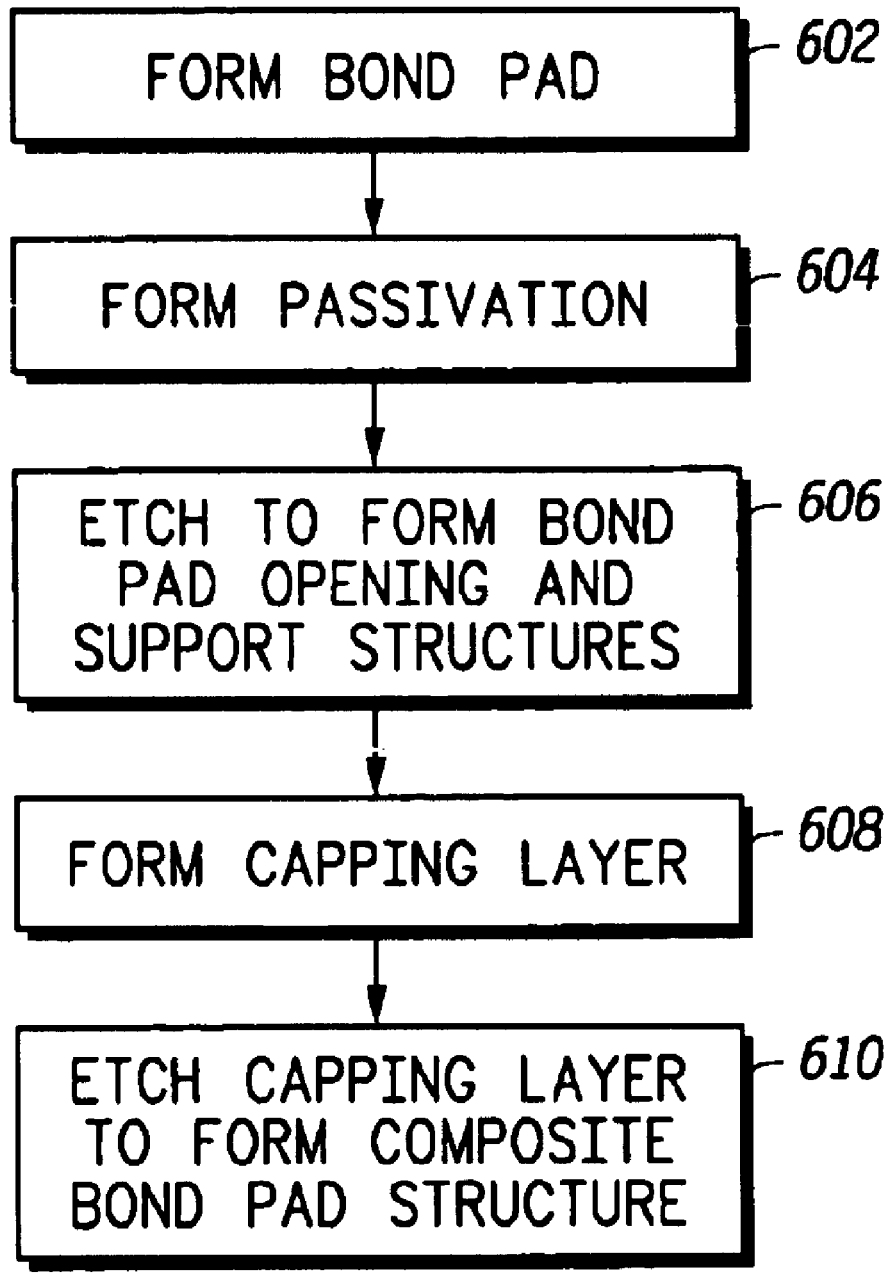
FIG. 6 illustrates a flow diagram of a method for forming a composite bond pad in accordance with a particular embodiment of the present invention.

FIG. 6 illustrates a flow diagram of a method for forming a semiconductor device that includes a composite bond pad structure. The method begins at step 602 where a conductive bond pad is formed over a semiconductor substrate. Typically, the conductive bond pad is mostly copper in composition. Formation of the conductive bond pad may include forming dielectric studs within the conductive bond pad. As was described with respect to FIG. 3, the dielectric studs may provide additional physical support to the composite bond pad structure.

At step 604, a dielectric layer (passivation layer) is formed over the conductive bond pad. At step 606, portions of the dielectric layer are removed to form a plurality of support structures that overlie the bond pad. Typically, the step of removing the portions is accomplished through etching the dielectric layer. Removing portions of the dielectric layer also exposes a portion of the bond pad to permit electrical coupling.

At step 608 a conductive capping layer is formed overlying the plurality of support structures. The conductive capping layer electrically contacts a portion of the bond pad, where the electrical contact occurs where portions of the first dielectric layer have been removed to expose the bond pad. The conductive capping layer may include aluminum, or may also be constructed of a material such as nickel or platinum.

As was described with respect to the cross section of FIG. 2, the capping layer may be separated from the conductive bond pad by a barrier layer. Typically, the barrier layer is formed of a material such as tantalum, titanium, tungsten chromium, or the nitrides of these materials. At step 610 the capping layer is etched to form the composite bond pad structure.

By including a perforated dielectric layer between a capping layer and an underlying bond pad of a composite bond pad structure, electrical connectivity between the conductive layers of the bond pad structure is maintained while providing some level of physical isolation between the conductive structures. As such, problems resulting from damage to the interface between the capping layer and the bond pad which may have resulted from probe needles in prior art bond pad structures are avoided. In addition, forming the capping layer with a self-passivating material ensures that degradation due to corrosion or other environmentally induced effects is minimized. Support structures in the perforated dielectric layer also help buffer external forces such that damage to the semiconductor device is avoided.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of forming a semiconductor device, comprising:
    forming a first interconnect level over a semiconductor substrate;
    forming an uppermost interconnect level that includes an interconnect portion and a bond pad over the first interconnect level, wherein:
        the interconnect portion contacts the first interconnect level by way of vias through an interlevel dielectric layer, and wherein all vias interconnecting the interconect portion and the first interconnect level are positioned outside regions directly below the bond pad;
    forming a passivation layer over the uppermost interconnect level;
    removing portions of the passivation layer, wherein removing portions of the passivation layer exposes portions of the bond pad and forms a plurality of support structures overlying the uppermost surface of the bond pad; and
    forming a conductive capping layer overlying the plurality of support structures, wherein the conductive capping layer electrically contacts the bond pad;
    wherein the plurality of support structures are interconnected with unremoved portions of the passivation layer.

2. The method of claim 1, wherein forming the uppermost interconnect level further comprises forming the bond pad over at least one dielectric layer having a Young's modulus less than approximately 50 Giga Pascals.

3. A method of forming a semiconductor device, comprising:
    forming a first interconnect level over a semiconductor substrate;
    forming an uppermost interconnect level that includes an interconnect portion and a bond pad over the first interconnect level, wherein:
        the interconnect portion contacts the first interconnect level by way of vias through an interlevel dielectric layer, and wherein all vias interconnecting the interconnect portion and the first interconnect level are positioned outside regions directly below the bond pad;
    forming a passivation layer over the uppermost interconnect level;
    removing portions of the passivation layer, wherein removing portions of the passivation layer exposes portions of the bond pad and forms a plurality of support structures overlying the uppermost surface of the bond pad; and
    forming a conductive capping layer overlying the plurality of support structures, wherein the conductive capping layer electrically contacts the bond pad;
    forming a barrier layer between the capping layer and the bond pad, wherein the barrier layer overlies the support structures and abuts exposed portions of the bond pad.

4. The method o claim 3, wherein the barrier layer includes a material selected from a group consisting of tantalum, titanium, tungsten, and chromium.

5. A method of forming a semiconductor device, comprising:

depositing a dielectric layer over a semiconductor substrate;

patterning and etching a trench opening within the dielectric layer;

depositing a copper layer over the dielectric layer and within the trench opening;

removing portions of the copper layer not contained within the trench opening to define an unpermost interconnect level comprising a copper bond pad and an interconnect portion, wherein the interconnect portion physically couples to an underlying intereconnect level by way of vias, wherein the vias are positioned beyond regions directly below the copper bond pad;

forming a passivation layer over the uppermost copper bond pad;

pattering and etching the passivation layer to define openings and support structures overlying the uppermost copper bond pad;

depositing a conductive layer over the support structures and within the openings, wherein the conductive layer electrically contacts the uppermost copper bond pad;

patterning and etching the conductive layer to define a capping film over the support structures and the openings;

forming a barrier layer overlying the support structures and within the openings prior to forming the conductive layer, wherein the barrier layer electrically contacts the uppermost copper bond pad.

6. The method of claim 5, wherein the barrier layer is further characterized as a tantalum barrier layer.

7. The method of claim 6, wherein the conductive film is further characterized as an aluminum film.

8. The method of claim 5, wherein the barrier layer includes a material selected from a group consisting of titanium, chromium, tantalum nitride, titanium nitride, and chromium nitride.

9. The method of claim 3, wherein a copper content of uppermost interconnect level is at least 90 atomic percent.

10. The method of claim 3, further comprising forming dielectric studs within the bond pad, wherein at least a portion of a support structure overlies a portion of a dielectric stud.

11. The method of claim 3, wherein the dielectric layer includes a material selected from a group consisting of a nitrogen, a hydrogen, and a carbon containing silicon oxide.

12. The method of claim 3, wherein the conductive capping layer includes aluminum.

13. The method of claim 3, wherein the conductive capping layer includes a material selected from the group consisting of nickel and palladium.

14. The method of claim 5, further comprising dielectric studs disposed within the uppermost copper bond pad, wherein at least a part of a support structure overlies a dielectric stud.

15. The method of claim 5, wherein the passivation layer includes a material selected from a group consisting of nitrogen-containing silicon oxide, a hydrogen containing silicon oxide, and a carbon containing silicon oxide.

16. The method of claim 5, wherein at least one of the support structures is interconnected with unremoved portions of the passivation layer.

* * * * *

UNITED STATES PATENT AND TRADEMARK OFFICE
CERTIFICATE OF CORRECTION

| | | |
|---|---|---|
| PATENT NO. | : 6,803,302 B2 | Page 1 of 1 |
| APPLICATION NO. | : 09/443443 | |
| DATED | : October 12, 2004 | |
| INVENTOR(S) | : Scott K. Pozder et al. | |

It is certified that error appears in the above-identified patent and that said Letters Patent is hereby corrected as shown below:

In Column 8, Line 65, Claim No. 4:
    Change "o" to --of--.

In Column 9, Line 11, Claim No. 5:
    Change "unpermost" to --uppermost--.

Signed and Sealed this

Seventeenth Day of May, 2011

David J. Kappos
*Director of the United States Patent and Trademark Office*